United States Patent
Lin et al.

(10) Patent No.: US 11,277,117 B2
(45) Date of Patent: Mar. 15, 2022

(54) FILTER, FILTERING METHOD, AND FILTER SYSTEM

(71) Applicant: Realtek Semiconductor Corporation, Hsinchu (TW)

(72) Inventors: Wei-Chen Lin, Hsinchu (TW); Hsuan-Yi Su, Hsinchu (TW); Chih-Lung Chen, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/984,516

(22) Filed: Aug. 4, 2020

(65) Prior Publication Data
US 2021/0257994 A1 Aug. 19, 2021

(30) Foreign Application Priority Data
Feb. 13, 2020 (TW) .................... 109104584

(51) Int. Cl.
| H03B 1/00 | (2006.01) |
| H03K 5/00 | (2006.01) |
| H04B 1/10 | (2006.01) |
| H03H 11/12 | (2006.01) |
| H03F 3/45 | (2006.01) |

(52) U.S. Cl.
CPC ......... *H03H 11/12* (2013.01); *H03F 3/45475* (2013.01); *H03F 2200/129* (2013.01); *H03F 2203/45116* (2013.01); *H03F 2203/45526* (2013.01)

(58) Field of Classification Search
CPC ............................ H03H 11/12; H03F 3/45475
USPC ........................................................ 327/553
See application file for complete search history.

(56) References Cited

U.S. PATENT DOCUMENTS

| 5,949,832 A | * | 9/1999 | Liebetreu | H04L 1/0059 375/344 |
| 8,208,590 B2 | | 6/2012 | Okada et al. | |
| 8,742,844 B2 | * | 6/2014 | Kousai | H03G 3/3042 330/136 |
| 2010/0260295 A1 | * | 10/2010 | Okada | H04B 1/1036 375/350 |
| 2012/0194265 A1 | * | 8/2012 | Katsube | H03H 11/1252 327/554 |
| 2018/0212582 A1 | * | 7/2018 | Sandhu | H03H 7/0153 |

FOREIGN PATENT DOCUMENTS

| EP | 2429076 A2 * | 3/2012 | ......... H03H 11/1291 |
| TW | I692938 B | 5/2020 | |

OTHER PUBLICATIONS

U.S. Appl. No. 16/787,239, filed Feb. 11, 2020.

* cited by examiner

*Primary Examiner* — Metasebia T Retebo
(74) *Attorney, Agent, or Firm* — Locke Lord LLP; Tim Tingkang Xia, Esq.

(57) ABSTRACT

A filter includes multiple filter circuits. The filter circuits are coupled in series between an input terminal and an output terminal, to generate an output signal according to an input signal. One of the filter circuits operates as an active filter circuit or a passive filter circuit according to amplitude of the input signal.

20 Claims, 3 Drawing Sheets

FILTER, FILTERING METHOD, AND FILTER SYSTEM

RELATED APPLICATIONS

This application claims priority to Taiwanese Application Serial Number 109104584 filed Feb. 13, 2020, which is herein incorporated by reference.

BACKGROUND

Technical Field

The present disclosure relates to a circuit technology. More particularly, the present disclosure relates to a filter, a filtering method, and a filter system.

Description of Related Art

With developments of technology, filters have been applied to various circuitries. The filters are configured to filter signals in unrequired frequency bands for subsequent signal processing. However, since an active filter needs power, it takes setting time when the active filter is started up, such that the system becomes stable.

SUMMARY

One embodiment of the present disclosure is related to a filter. The filter includes multiple filter circuits. The filter circuits are coupled in series between an input terminal and an output terminal, to generate an output signal according to an input signal. One of the filter circuits operates as an active filter circuit or a passive filter circuit according to amplitude of the input signal.

One embodiment of the present disclosure is related to a filtering method for a filter. The filter includes multiple filter circuits. The filtering method includes following steps: detecting an input signal to generate a detection result; and based on the detection result, determining one of the filtering circuits to operate as an active filter circuit or a passive filter circuit.

One embodiment of the present disclosure is related to a filter system. The filter system includes a frequency mixer, a filter, and an analog-to-digital converter. The frequency mixer is configured to generate an input signal. The filter is configured to generate an output signal according to the input signal. The analog-to-digital converter is configured to generate a digital output according to the output signal. An active filter circuit of the filter is adjusted to be a passive filter circuit if a bit error rate of the digital output is lower than a predetermined value.

As the above embodiments, the filter, the filtering method, and the filter system of the present disclosure have low power consumption and can save setting time.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
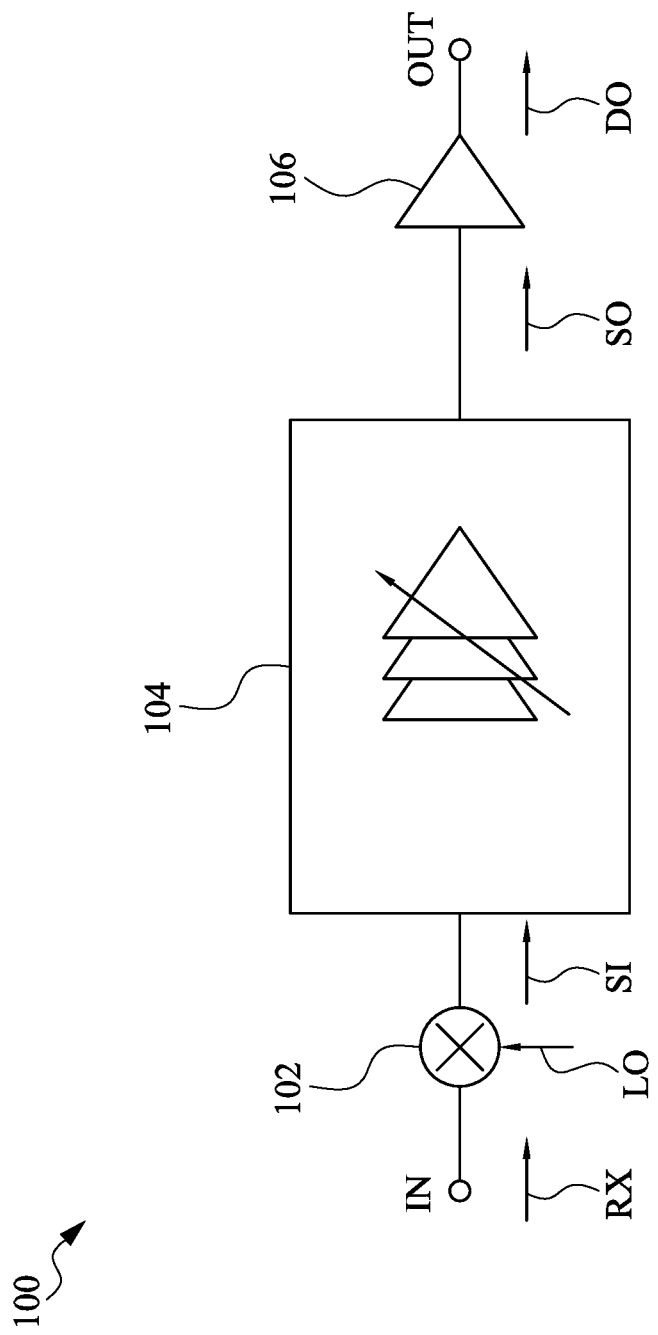
FIG. 1 is a schematic diagram illustrating a filter system according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "circuitry" may indicate a system formed with one or more circuits. The term "circuit" may indicate an object, which is formed with one or more transistors and/or one or more active/passive elements based on a specific arrangement, for processing signals.

In the present disclosure, "connected" or "coupled" may refer to "electrically connected" or "electrically coupled." "Connected" or "coupled" may also refer to operations or actions between two or more elements.

Various embodiments of the present technology are discussed in detail below with figures. It should be understood that the details should not limit the present disclosure. In other words, in some embodiments of the present disclosure, the details are not necessary. In addition, for simplification of figures, some known and commonly used structures and elements are illustrated simply in figures.

Reference is made to FIG. 1. FIG. 1 is a schematic diagram illustrating a filter system 100 according to some embodiments of the present disclosure. In some embodiments, the filter system 100 may be applied to a wireless communication system. The wireless communication system is, for example, a communication system with Wi-Fi technology or Bluetooth technology. For example, the filter system 100 may be applied to a transceiver with Wi-Fi technology or Bluetooth technology, but the present disclosure is not limited thereto.

As illustrated in FIG. 1, the filter system 100 includes a frequency mixer 102, a filter 104, and an analog-to-digital converter 106. The filter 104 is coupled between the frequency mixer 102 and the analog-to-digital converter 106.

The frequency mixer 102 receives a high frequency input signal RX at an input terminal IN. The frequency mixer 102 further receives a local oscillator frequency signal LO. The frequency mixer 102 is configured to perform a frequency mixing process on the high frequency input signal RX and the local oscillator frequency signal LO, to generate an input signal SI transmitted to the filter 104. The input signal SI is, for example, an intermediate frequency signal.

The filter 104 receives the input signal SI. The filter 104 is configured to filter the input signal SI, to generate an output signal SO at an output terminal OUT. In specific, the filter 104 provides a filtering response to process the input signal SI, to generate the output signal SO. The filtering response is configured to allow signals in specific frequency bands of the input signal SI to pass through, to shape the input signal SI to be the output signal SO. In different applications, the aforementioned filtering response may be a low-pass filtering, a high-pass filtering, a band-pass filtering, or a band-rejection filtering.

The analog-to-digital converter 106 receives the output signal SO. The analog-to-digital converter 106 is configured to perform an analog-to-digital conversion on the output signal SO, to generate a digital output DO.

The implementations of the filter system 100 above are for illustration, and various implementations of the filter system 100 are within the contemplated scopes of the present disclosure.

Figure 2:
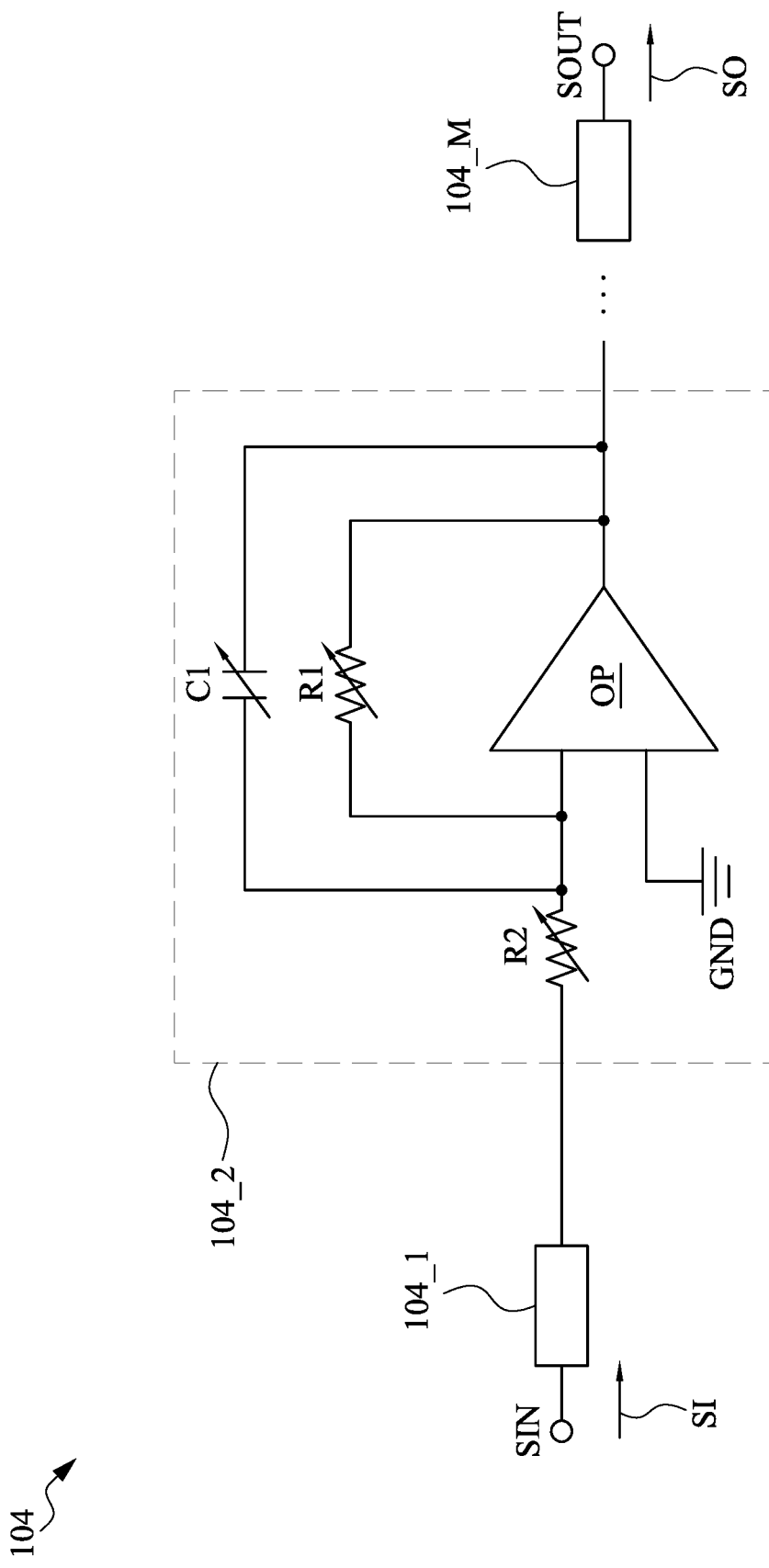
FIG. 2 is a schematic diagram illustrating a filter in FIG. 1 according to some embodiments of the present disclosure.

Reference is made to FIG. 2. FIG. 2 is a schematic diagram illustrating the filter 104 in FIG. 1 according to some embodiments of the present disclosure. As illustrated in FIG. 2, the filter 104 includes M-stages filter circuits 104_1-104_M. M is a positive integer greater than 1. The filter 104 includes an input terminal SIN and the output terminal SOUT. The M-stages filter circuits 104_1-104_M are coupled in series between the input terminal SIN and the output terminal SOUT, to filter the input signal SI from the frequency mixer 102 and generate the output signal SO at the output terminal SOUT.

In some embodiments, the input terminal SIN may be a single-ended input terminal. In some embodiments, the input terminal SIN may be differential input terminals, and the input signal SI is a difference between two differential input signals. In some embodiments, the output terminal SOUT may be a single-ended output terminal. In some embodiments, the output terminal SOUT may be differential output terminals, and the out signal SOUT is a difference between two differential output signals.

For simplicity and ease of understanding, FIG. 2 merely illustrates elements of one filter circuit (for example, the filter circuit 104_2). Each of other filter circuits has the same circuit structure and operations.

The filter circuit 104_2 is taken as an example, and the filter circuit 104_2 includes an amplifier OP, a capacitor C1, a resistor R1, and a resistor R2. The capacitor C1 and the amplifier OP are coupled in parallel. The resistor R1 and the capacitor C1 are coupled in parallel. The amplifier OP includes two input terminals. The resistor R2 is coupled between one of the two input terminals of the amplifier OP and a previous stage filter circuit 104_1. Another input terminal of the amplifier OP is coupled to a ground terminal GND. In some embodiments, the capacitor C1 is implemented by a variable capacitor, and each of the resistor R1 and the resistor R2 is implemented by a variable resistor, but the present disclosure is not limited thereto.

The implementations of the filter circuit 104_2 and other filter circuits are for illustration, and various implementations of the filter circuit 104_2 and other filter circuits are within the contemplated scopes of the present disclosure.

References are made to FIG. 1 and FIG. 2. In some embodiments, a detector circuit (not shown) is disposed in the filter system 100. The detector circuit is configured to detect amplitude of the input signal SI, and compare the detected amplitude with an amplitude threshold value, to generate a detection result.

Based on the detection result above, it can determine that each of the M-stages filter circuits 104_1-104_M operates as an active filter circuit or a passive filter circuit. In some embodiments, an active filter circuit is a filter circuit with an amplify gain. For example, if the amplifier OP of the filter circuit 104_2 is powered on, the filter circuit 104_2 has an amplify gain and operates as an active filter circuit. Alternatively, a passive filter circuit is a filter circuit without an amplify gain. For example, if the amplifier OP of the filter circuit 104_2 is powered off, the filter circuit 104_2 does not have an amplify gain and operates as a passive filter circuit.

In operation, the M-stages filter circuits 104_1-104_M are preset to be active filter circuits. In other words, the amplifiers OP of the M-stages filter circuits 104_1-104_M are preset to be powered on.

When the detection result indicates that the amplitude of the input signal SI is greater than the amplitude threshold value, the gain of the filter 104 can be adjusted to be smaller. In this situation, at least one of the M-stages filter circuits 104_1-104_M is adjusted to be a passive filter circuit, and the other filter circuits are kept to be active filter circuits. For example, if the filter circuit 104_2 is selected to be adjusted to be the passive filter circuit, the amplifier OP of the filter circuit 104_2 is adjusted to be powered off, and the amplifiers OP of the other filter circuits are kept to be powered on. In some embodiments, the at least one filter circuit is selected, based on an expected output signal SO and quality factor values of the M-stages filter circuits 104_1-104_M, to be adjusted as the passive filter circuit.

In some embodiments, if the detection result indicates that the amplitude of the input signal SI is much greater than the amplitude threshold value, the gain of the filter 104 can be adjusted to be very small. In this situation, one of the M-stages filter circuits 104_1-104_M is adjusted to be an active filter circuit, and the other filter circuits are kept to be passive filter circuits. In other words, if only the filter circuit 104_2 is determined to be kept to be the active filter circuit, the amplifier OP of the filter circuit 104_2 is kept to be powered on and the amplifiers OP of the other filter circuits are kept to be powered off. In some embodiments, the at least one filter circuit is selected, based on the expected output signal SO and quality factor values of the M-stages filter circuits 104_1-104_M, to be adjusted as the active filter circuit.

In some other embodiments, based on a required gain, all of the M-stages filter circuits 104_1-104_M may be adjusted to be passive filter circuits. In other words, the amplifiers OP of the M-stages filter circuits 104_1-104_M are adjusted to be powered off, to reduce power consumption of the filter 140 significantly.

Alternatively, if the detection result indicates that the amplitude of the input signal SI is equal to or less than the amplitude threshold value, the amplifiers OP of the M-stages filter circuits 104_1-104_M are kept to be powered on, such that the M-stages filter circuits 104_1-104_M are kept to be active filter circuits, to provide an amplify gain. Based on the amplify gain, amplitude of the output signal SO is adjusted to be larger, and thus the subsequent operations are not prone to fail.

The high frequency input signal RX is associated with the input signal SI. Thus, in some embodiments, the detector circuit can be configured to detect amplitude of the high frequency input signal RX, and to compare the detected amplitude with an amplitude threshold value, so as to generate a detection result. As shown in the descriptions above, the filter circuits of the filter 140 are adjusted according to the detection result.

In some related approaches, the filter is implemented only by multiple active filter circuits. Since the active filter circuits need power, the filter is not suitable for applications with low power consumption (for example, Wi-Fi or Bluetooth).

Compared to these related approaches, the filter 140 of the present disclosure is implemented by a mix of active filter circuits and passive filter circuits, and thus the filter 140 of the present disclosure has low power consumption. In addition, when a passive filter circuit is adjusted to be an active filter circuit (an amplifier OP is adjusted from being powered off to being powered on), it takes setting time when the active filter is started up, such that the system becomes stable. The filter 140 of the present disclosure presets the M-stages filter circuits 104_1-104_M to be active filter circuits, and thus the aforementioned setting time can be saved. In other words, the filter 140 of the present disclosure has advantages of low power consumption and short setting time.

In some embodiments, if bit error rate (BER) of the digital output DO is lower than a predetermined value, at least one of active filter circuits is adjusted to be a passive filter circuit. In this situation, since the bit error rate of the digital output DO is low, requirements of the system are still met after the at least one of active filter circuits is adjusted to be the passive filter circuit. In addition, switching from the active filter circuit to the passive filter circuit can reduce power consumption of the system.

Figure 3:
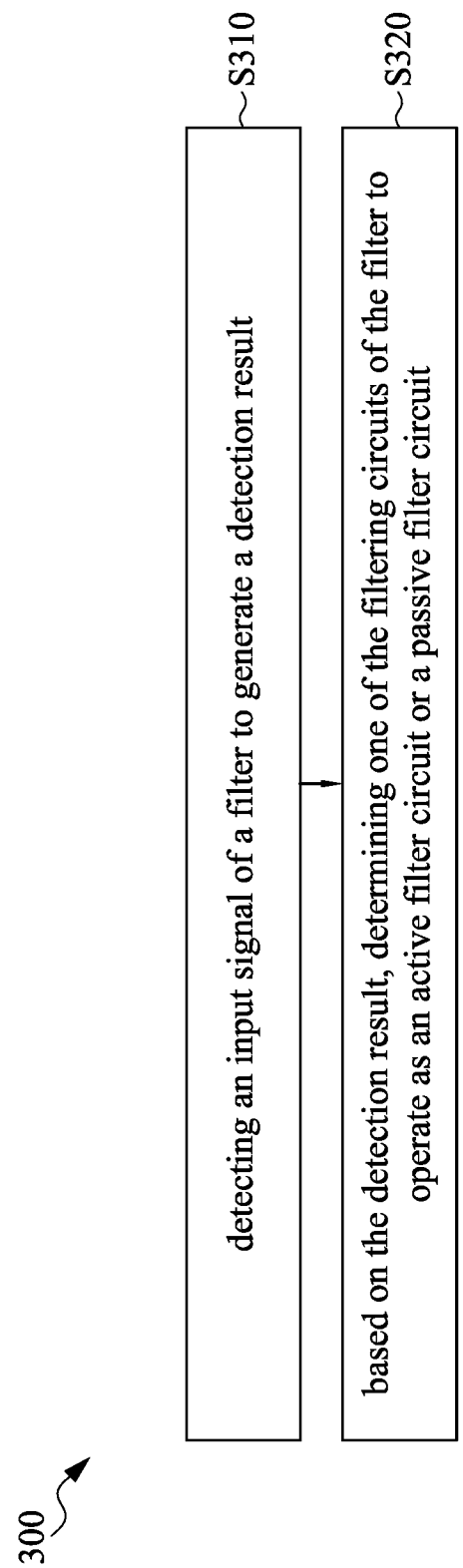
FIG. 3 is a flow diagram illustrating a filtering method according to some embodiments of the present disclosure.

Reference is made to FIG. 3. FIG. 3 is a flow diagram illustrating a filtering method 300 according to some embodiments of the present disclosure. The filtering method 300 includes operations S310 and S320. For ease of understanding, the filtering method 300 is discussed with reference to FIG. 1 and FIG. 2.

The operation S310 is for detecting the input signal SI or the high frequency input signal RX of the filter 104 to generate the detection result. In some embodiments, the detector circuit detects the amplitude of the input signal SI or the high frequency input signal RX, and compares the detected amplitude with the amplitude threshold value, to generate the detection result.

The operation S320 is for determining one of M-stages filter circuits 104_1-104_M to operate as an active filter circuit or a passive filter circuit based on the detection result above. In some embodiments, when the detection result indicates that the amplitude of the input signal SI, or when the amplitude of the high frequency input signal RX is greater than the amplitude threshold value, the gain of the filter 104 can be adjusted to be smaller. In this situation, at least one of the M-stages filter circuits 104_1-104_M or all of the M-stages filter circuits 104_1-104_M are adjusted to be passive filter circuits. When the detection result indicates that the amplitude of the input signal SI or the amplitude of the high frequency input signal RX is equal to or less than the amplitude threshold value, all of the M-stages filter circuits 104_1-104_M can be kept to be active filter circuits.

The above description of the filtering method 300 includes exemplary operations, but the operations of the filtering method 300 are not necessarily performed in the order described. The order of the operations of the filtering method 300 disclosed in the present disclosure are able to be changed, or the operations are able to be executed simultaneously or partially simultaneously as appropriate, in accordance with the spirit and scope of various embodiments of the present disclosure.

As shown in the above embodiments, the filter, the filtering method, and the filter system of the present disclosure have low power consumption and can save setting time.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script in a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A filter, comprising:
   a plurality of filter circuits coupled in series between an input terminal and an output terminal, to generate an output signal according to an input signal, wherein one of the filter circuits operates as an active filter circuit, wherein the one of the filter circuits operates as a passive filter circuit when amplitude of the input signal at the input terminal is greater than an amplitude threshold value, wherein the one of the filter circuits comprises:
   an amplifier;
   a capacitor coupled to the amplifier in parallel;
   a first resistor coupled to the capacitor in parallel; and
   a second resistor coupled to the amplifier.

2. The filter of claim 1,
   wherein the amplifier is powered on or powered off according to the amplitude of the input signal.

3. The filter of claim 2, wherein the amplifier is preset to be powered on, wherein the amplifier is powered off when the amplitude of the input signal is greater than the amplitude threshold value.

4. The filter of claim 3, wherein the powered off amplifier is determined based on a plurality of quality factor values of the filter circuits.

5. The filter of claim 3, wherein each of the filter circuits is the passive filter circuit.

6. The filter of claim 3, wherein the amplifier is kept to be powered on when the amplitude of the input signal is equal to or less than the amplitude threshold value.

7. The filter of claim 2, wherein the first resistor or the second resistor is a variable resistor.

8. The filter of claim 2, wherein the capacitor is a variable capacitor.

9. The filter of claim 1, wherein the one of the filter circuits is kept to be the active filter circuit, and each of other filter circuits is adjusted to be the passive filter circuit.

10. The filter of claim 9, wherein the one of the filter circuits kept to be the active filter circuit is determined based on a plurality of quality factor values of the filter circuits.

11. A filtering method for a filter, wherein the filter comprises a plurality of filter circuits, wherein the filtering method comprises:
detecting an input signal at an input terminal of the filter to generate a detection result; and
based on the detection result, determining one of the filtering circuits to operate as an active filter circuit or a passive filter circuit,
wherein the one of the filter circuits operates as an active filter circuit, wherein the one of the filter circuits operates as a passive filter circuit when amplitude of the input signal at the input terminal is greater than an amplitude threshold value, wherein the one of the filter circuits comprises:
an amplifier;
a capacitor coupled to the amplifier in parallel;
a first resistor coupled to the capacitor in parallel; and
a second resistor coupled to the amplifier.

12. The filtering method of claim 11, wherein generating the detection result comprises:
detecting the amplitude of the input signal; and
comparing the detected amplitude and the amplitude threshold value, to generate the detection result.

13. The filtering method of claim 12, further comprising:
powering on or powering off an amplifier of the one of the filter circuits based on the detection result.

14. The filtering method of claim 13, wherein powering on or powering off the amplifier of the one of the filter circuits based on the detection result comprises:

presetting the amplifier to be powered on; and
powering off the amplifier when the detection result indicates that the amplitude of the input signal is greater than the amplitude threshold value.

15. The filtering method of claim 14, further comprising:
determining the powered off amplifier based on a plurality of quality factor values of the filter circuits.

16. The filtering method of claim 14, further comprising:
keeping the amplifier to be powered on when the detection result indicates that the amplitude of the input signal is equal to or less than the amplitude threshold value.

17. The filtering method of claim 11, wherein the one of the filter circuits is kept to be the active filter circuit, and each of other filter circuits is adjusted to be the passive filter circuit.

18. The filtering method of claim 17, further comprising:
determining the one of the filter circuits kept to be the active filter circuit based on a plurality of quality factor values of the filter circuits.

19. A filter system, comprising:
a frequency mixer configured to generate an input signal;
a filter configured to generate an output signal according to the input signal; and
an analog-to-digital converter configured to generate a digital output according to the output signal,
wherein an active filter circuit of the filter is adjusted to be a passive filter circuit when a bit error rate of the digital output is lower than a predetermined value.

20. The filtering system of claim 19, wherein the active filter circuit comprises:
an amplifier;
a capacitor coupled to the amplifier in parallel;
a first resistor coupled to the capacitor in parallel; and
a second resistor coupled to the amplifier,
wherein the amplifier is adjusted to be powered off when the bit error rate of the digital output is lower than the predetermined value.

* * * * *